United States Patent
Tsukahara et al.

(10) Patent No.: US 7,186,925 B2
(45) Date of Patent: Mar. 6, 2007

(54) ELECTRONIC CIRCUIT DEVICE AND METHOD OF MANUFACTURING THE SAME

(75) Inventors: Norihito Tsukahara, Kyoto (JP); Kazuhiro Nishikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 29 days.

(21) Appl. No.: 10/798,398

(22) Filed: Mar. 12, 2004

(65) Prior Publication Data

US 2004/0200065 A1   Oct. 14, 2004

(30) Foreign Application Priority Data

Mar. 24, 2003   (JP) ............... 2003-080299

(51) Int. Cl.
*H05K 1/16* (2006.01)
(52) U.S. Cl. ............ 174/260; 174/259; 257/737
(58) Field of Classification Search .......... 174/260, 174/259, 261; 257/737; 361/760, 767, 768
See application file for complete search history.

(56) References Cited

U.S. PATENT DOCUMENTS

| | | | |
|---|---|---|---|
| 5,889,326 A * | 3/1999 | Tanaka .................. 257/737 |
| 6,245,696 B1 * | 6/2001 | Haas et al. ............. 442/348 |
| 6,252,301 B1 * | 6/2001 | Gilleo et al. ............ 257/690 |
| 6,297,560 B1 * | 10/2001 | Capote et al. ........... 257/778 |
| 6,333,469 B1 * | 12/2001 | Inoue et al. ............. 174/260 |
| 6,429,516 B1 * | 8/2002 | Tsunoi .................. 257/737 |
| 6,512,185 B2 * | 1/2003 | Itou .................... 174/260 |
| 6,675,469 B1 * | 1/2004 | Haba et al. .............. 29/830 |

FOREIGN PATENT DOCUMENTS

JP   2000-340607   12/2000

* cited by examiner

*Primary Examiner*—Ishwar (I. B.) Patel
(74) *Attorney, Agent, or Firm*—Wenderoth, Lind & Ponack, L.L.P.

(57) ABSTRACT

An electronic component having connection terminals on one side thereof is bonded to a circuit board via an adhesive sheet having through-holes. The connection terminals on the electronic component are connected to electrode pads provided on the circuit board via a conductive adhesive in the through-holes. Thus, an electronic circuit device is formed. Using a polymeric resin film sheet for the circuit board and mounting an electronic component, e.g. an LSI, onto the circuit board can provide a small, light, thin, and inexpensive electronic circuit device.

6 Claims, 5 Drawing Sheets ance with an exemplary embodiment of the present invention.

ELECTRONIC CIRCUIT DEVICE AND METHOD OF MANUFACTURING THE SAME

FIELD OF THE INVENTION

The present invention relates to an electronic circuit device using a polymeric resin sheet as substrate material of a circuit board on which electronic components are mounted, and a method of manufacturing the electronic circuit device.

BACKGROUND OF THE INVENTION

1. Field of the Invention

In recent years, there have been an increasing number of demands for reduction in size, weight, and thickness of electronic circuit devices incorporated into electronic equipment, such as a portable phone. For this purpose, a technique of mounting high-density thin electronic components, such as large scale integrated circuits (hereinafter referred to as LSIs), has been proposed.

2. Background Art

For example, Japanese Patent Unexamined Publication No. 2000-340607 is disclosed. FIGS. 5A–5C are sectional views showing major steps of manufacturing a conventional electronic circuit device. The conventional electronic circuit device is structured so that electrodes (not shown) on circuit board 41 are connected to corresponding connection terminals (not shown) on LSI 42 via solder bumps 43.

A method of manufacturing the conventional electronic circuit device is described with reference to FIGS. 5A–5C.

First, as shown in FIG. 5A, a plurality of solder bumps 43 are formed on the electrodes on circuit board 41.

Next, as shown in FIG. 5B, adhesive sheet 45, including thermoplastic polyimide resin and having cylindrical holes 44, is bonded to LSI 42. At this time, the adhesive sheet is bonded to the LSI so that cylindrical holes 44 through adhesive sheet 45 correspond to the connection terminals provided on LSI 42.

Next, as shown FIG. 5C, solder bumps 43 formed on circuit board 41 are fitted into corresponding cylindrical holes 44 through adhesive sheet 45. Further, circuit board 41 and LSI 42 are pressed and heated to at least a melting temperature of solder bumps 43. Then melting of solder bumps 43 connects the connection terminals on LSI 42 and corresponding electrodes on circuit board 41. At the same time, bonding circuit board 41 and LSI 42 via adhesive sheet 45, softened by heating, forms an electronic circuit device.

However, in the conventional electronic circuit device, solder having a melting point of at least 200° C. is used as an electrically connecting material; thus, an inexpensive general-purpose polymeric resin sheet having a low heat-resistant temperature cannot be used as substrate material of a circuit board. Therefore, because expensive substrate material having a high heat-resistant temperature, e.g. epoxy resin including glass fiber or a ceramic plate, is used, there is a problem of an expensive electronic circuit device.

Further, there is another problem. When the adhesive sheet is heated to bond the LSI and circuit board, air may be mixed into the adhesive sheet, or melted solder may diffuse into adjacent bumps, thus decreasing insulation resistance. For this reason, it is difficult to manufacture highly reliable electronic circuit devices with high yields.

SUMMARY OF THE INVENTION

An electronic circuit device of the present invention is structured so that an electronic component, having connection terminals provided on one side thereof, and a circuit board are bonded via an adhesive sheet having through-holes formed therethrough, and the connection terminals on the electronic component and electrode pads on the circuit board are connected by conductive adhesive provided in the through-holes.

A method of manufacturing the electronic circuit device of the present invention includes the following steps of:

A) bonding the adhesive sheet to the circuit board so that the through-holes formed through the adhesive sheet are aligned with corresponding electrode pads provided on a surface of the circuit board;

B) providing conductive adhesive in the through-holes; and

C) bonding the connection terminals provided on the one side of the electronic component to the electrode pads provided on the circuit board with the conductive adhesive in the through-holes, and bonding the electronic component to the adhesive sheet.

DETAILED DESCRIPTION OF THE PREFERRED EMBODIMENTS

An exemplary embodiment of the present invention is described hereinafter with reference to FIGS. 1 through 4B. Same elements are denoted with the same reference marks and a detailed description of these elements is omitted.

Figure 1:
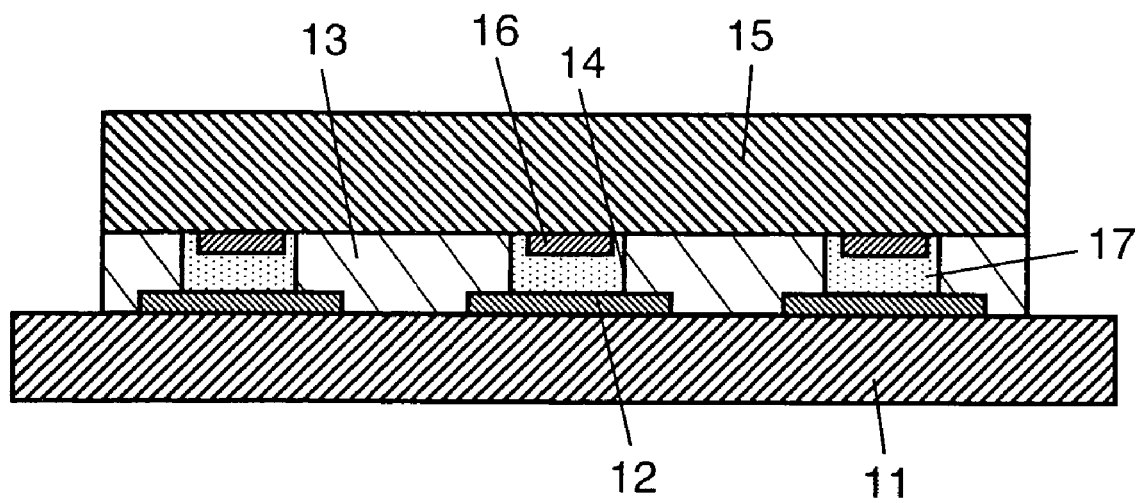
FIG. 1 is a sectional view schematically illustrating a structure of an electronic circuit device in accordance with an exemplary embodiment of the present invention.

FIG. 1 is a sectional view schematically illustrating a structure of an electronic circuit device in accordance with an exemplary embodiment of the present invention. Circuit board 11 having wiring patterns (not shown) formed thereon has electrode pads 12 in positions corresponding to connection terminals 16 on electronic component 15. Formed on a surface of one side of electronic component 15, e.g. an LSI, are connection terminals 16 each having a shape protruding at least from the surface of the electronic component.

Through adhesive sheet 13, through-holes 14, each having a shape to receive a respective connection terminal 16, are provided in positions corresponding to connection terminals 16. Connection terminals 16 on electronic component 15, and electrode pads 12 on circuit board 11 are bonded and electrically connected by conductive adhesive 17 provided in through-holes 14. Further, circuit board 11 and electronic component 15 are bonded via adhesive sheet 13. This enables a highly reliable connection.

Possible substrates for circuit board 11 include a heat-resistant substrate made of epoxy resin including glass fiber, or a ceramic plate, and a polymeric resin sheet including a film sheet made of polyethylene terephthalate (PET) resin, acrylnitrile-butadiene-styrene (ABS) resin, or polycarbonate resin. Any material used for a general circuit board is applicable. Especially preferable is a polymeric resin sheet made of PET resin, ABS resin, polycarbonate resin, or the like. Because such polymeric resin sheets find a wide variety of applications as general-purpose plastic, they are inexpensive. Additionally, because circuit board 11 can be formed to have a thickness ranging from approximately 50 to 400 µm, such polymeric resin sheets are effective in reducing a thickness of electronic circuit devices.

Applicable adhesive sheet 13 includes an adhesive sheet including thermosetting resin, e.g. epoxy resin or acrylic resin, and a generally well-known hot-melt sheet including thermoplastic resin. In this case, it is preferable that a thickness of adhesive sheet 13 ranges from 100 to 800 µm, in consideration of a thinner electronic circuit device and adhesive strength and connection resistance between circuit board 11 and electronic component 15.

Preferable conductive adhesive 17 is conductive paste in which conductive particles made of pulverized conductive material, e.g. gold (Au), silver (Ag), cupper (Cu), nickel (Ni), palladium (Pd), and Ag—Pd alloys, are dispersed in a binder. Especially, a binder including thermosetting resin, e.g. polyester resin, epoxy resin, acrylic resin, polyimide resin, or polyurethane resin, is preferable because it securely bonds electrode pads 12 on circuit board 11 to connection terminals 16 on electronic component 15.

Depending on material of circuit board 11 and a shape and material of electronic component 15, optimum combinations of adhesive sheet 13 and conductive adhesive 17 can be selected. Combinations of adhesive sheet 13 made of thermosetting resin and conductive adhesive 17 including thermosetting resin binder are preferable. Because these combinations are applicable even to circuit boards poor in heat resistance that are made of PET resin, ABS resin, or the like, circuit boards can be selected from a broader range. Most preferable among these is combinations in which thermosetting resin in adhesive sheet 13 starts curing at a lower temperature than does thermosetting resin binder in a conductive paste used as conductive adhesive 17. The combinations can prevent warp of adhesive sheet 13 when the thermosetting resin and the thermosetting resin binder are heated and cured.

As electronic component 15, general electronic components, such as chip components including LSIs, resistors, capacitors, and coils, can be used.

Figure 2A:
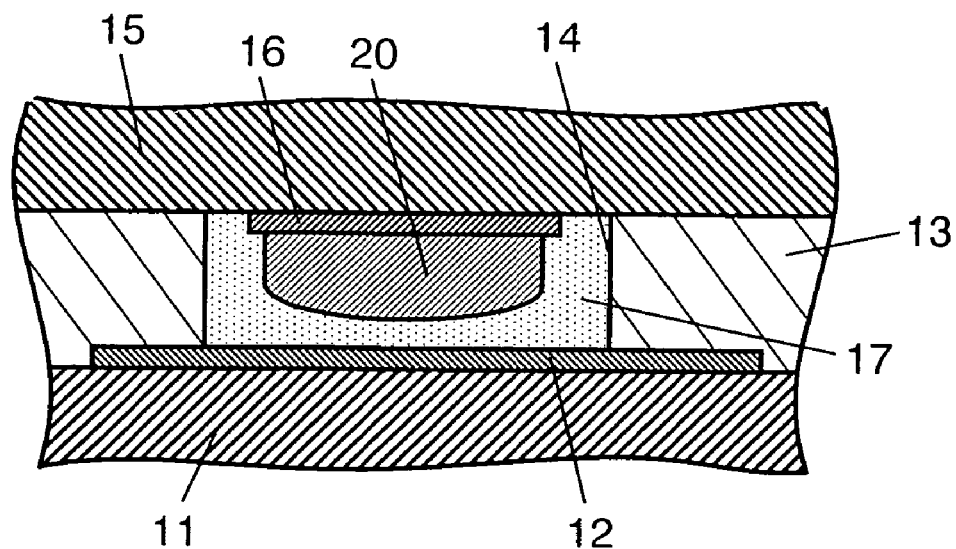
FIG. 2A is a sectional view schematically illustrating a structure in which a bump is formed on a surface of a connection terminal on an electronic component in an electronic circuit device in accordance with the exemplary embodiment of the present invention.
Figure 2B:
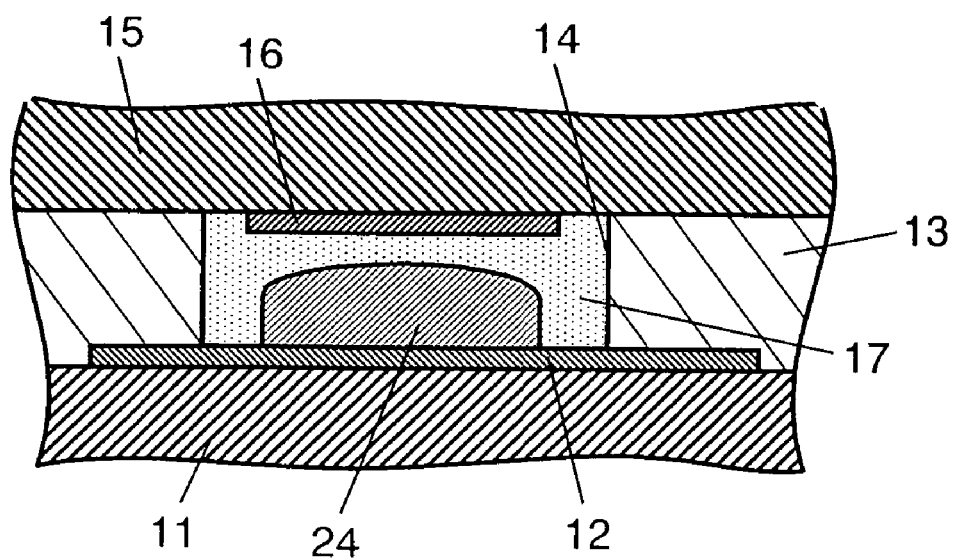
FIG. 2B is a sectional view schematically illustrating a structure in which a bump is provided on a side of an electrode pad on a circuit board in an electronic circuit device in accordance with the exemplary embodiment of the present invention.

As shown in FIG. 2A or 2B, an electronic circuit device can be structured so that bump 20 protruding into through-hole 14 is formed on at least one of connection terminal 16 on electronic component 15, and electrode pad 12 on circuit board 11. In other words, this structure increases an area in which conductive adhesive 17 is in contact with connection terminal 16 or electrode pad 12. This structure also allows connection terminal 16 and electrode pad 12 to be bonded more securely and decreases connection resistance between connection terminal 16 and electrode pad 12. The electronic circuit device can also be structured so that connection terminal 16 is in direct contact with electrode pad 12. In this case, connection resistance between connection terminal 16 and electrode pad 12 is further reduced.

FIG. 2A is a sectional view schematically illustrating a structure in which bump 20 is formed on a surface of connection terminal 16 on electronic component 15. On the surface of connection terminal 16, bump 20 made of Au is formed by a stud-bump bonding process, for example, and has a thickness ranging from approximately 10 to 100 µm. This structure increases an area in which the bump is in contact with conductive adhesive 17 and reduces a distance from the bump to electrode pad 12, thus drastically reducing connection resistance. As the shape of bump 20, it is necessary that an outer dimension thereof is smaller than at least a dimension of through-hole 14, provided through adhesive sheet 13, and a thickness thereof is smaller than at least that of adhesive sheet 13. There are no other restrictions. Materials of bump 20 include Cu, Ni, and solder, other than the above-mentioned Au. Bump 20 can be formed by plating, evaporation and sputtering, other than the stud-bump bonding process.

FIG. 2B is a sectional view schematically illustrating a structure in which bump 24 is provided on aside of electrode pad 12 on circuit board 11, for connection. Bump 24 is provided on electrode pad 12 on circuit board 11 for connection to connection terminal 16 on electronic component 15 via conductive adhesive 17. A method of forming bump 24, and material thereof, are the same as those of FIG. 2A.

As described above, forming bump 20 or 24 on at least one of electrode pad 12 on circuit board 11, and connection terminal 16 on electronic component 15, can reduce an amount of applied conductive adhesive 17. Further, if the amount of conductive adhesive 17 applied to through-hole 14 varies, a large contact area prevents variation in connection resistance.

In the embodiment of the present invention, connection terminals 16 on electronic component 15 do not necessarily protrude from the surface thereof. When connection terminals 16 are formed on electronic component 15 with the connection terminals recessed from a surface of the electronic component, the connection terminals can be connected to corresponding electrode pads 12 on circuit board 11 by forming bumps 20 on connection terminals 16.

As shown in FIGS. 1–2A, a cross-sectional size of the connection terminal 16 is less than a corresponding cross-sectional size of the through-hole 14, and the corresponding cross-sectional size of the through-hole is less than a corresponding cross-sectional size of the electrode pad 12, with the corresponding cross-sectional size of the electrode pad being at least twice as large as a the cross-sectional size of the connection terminal.

Hereinafter, a description is provided of a method of manufacturing an electronic circuit device in accordance with the exemplary embodiment of the present invention.

FIGS. 3A–4B are sectional views showing steps in a method of manufacturing an electronic circuit device in accordance with the exemplary embodiment of the present invention.

Figure 3A:
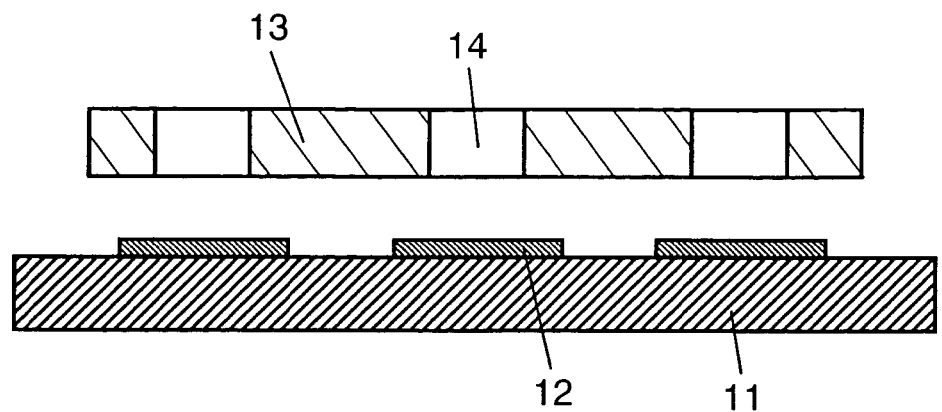
FIGS. 3A, 3B, and 3C are sectional views showing steps of a method of manufacturing an electronic circuit device in accordance with the exemplary embodiment of the present invention.

First, as shown in FIG. 3A, necessary wiring patterns (not shown) are formed on circuit board 11. On this circuit board 11, resistors, capacitors, semiconductor devices, or the like can be mounted by soldering or other methods. Alternatively, only wiring patterns can be formed. Then, electrode pads 12 are formed on circuit board 11 at predetermined positions on which electronic component 15 is to be mounted. Further, through adhesive sheet 13, including thermosetting resin, e.g. epoxy resin or acrylic resin, through-holes 14 are provided at positions corresponding to electrode pads 12 on circuit board 11.

Figure 3B:
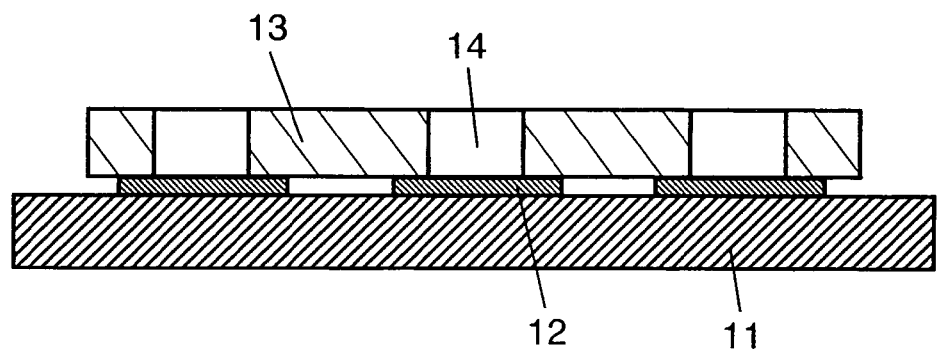

Next, as shown in FIG. 3B, adhesive sheet 13 is bonded to circuit board 11 so that through-holes 14, through adhesive sheet 13, are aligned with corresponding electrode pads 12 on circuit board 11 (sheet bonding step).

Figure 3C:
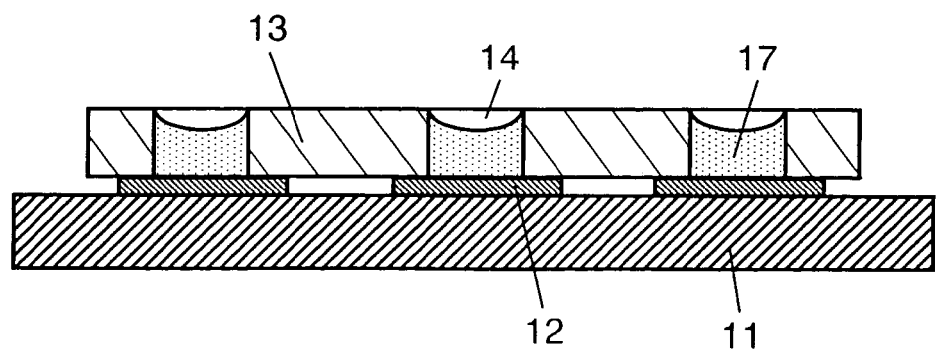

Next, as shown in FIG. 3C, through-holes 14, through adhesive sheet 13, are filled with conductive adhesive 17 (conductive adhesive filling step). Conductive adhesive 17 is provided into through-holes 14 by screen printing, an ink-jet process, plotting, transfer printing, or other various methods. At this time, it is desirable that conductive adhesive 17 is provided so that a height thereof is smaller than a height of through-holes 14, provided through adhesive sheet 13, in consideration of sizes of connection terminals 16 and bumps 20 or 24 to be received by through-holes 14.

Figure 4A:
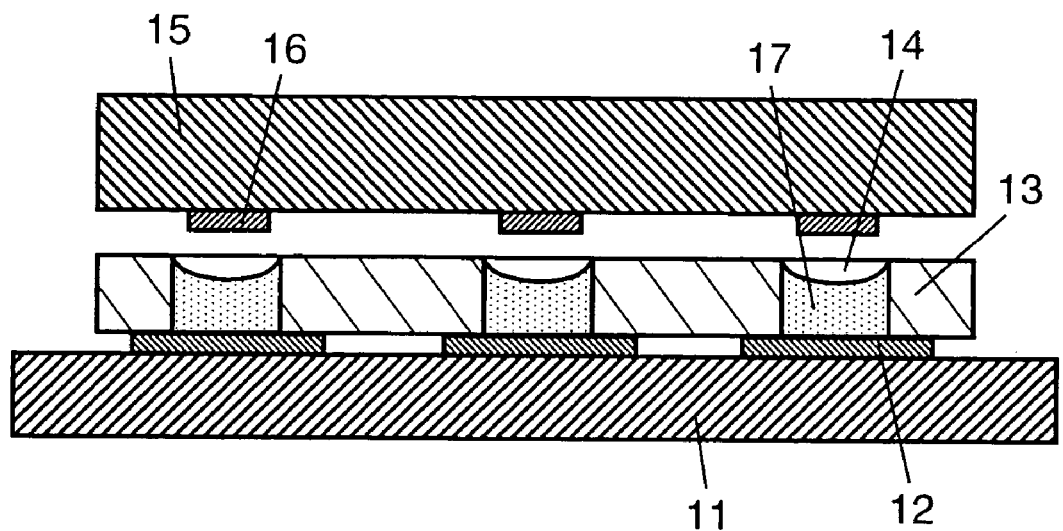
FIGS. 4A and 4B are sectional views showing steps of the method of manufacturing an electronic circuit device in accordance with the exemplary embodiment of the present invention.

Next, as shown in FIG. 4A, after electrode pads 12 on circuit board 11, having adhesive sheet 13 bonded thereto, are aligned with corresponding connection terminals 16 on electronic component 15, electronic component 15 is pressed onto adhesive sheet 13. This bonds circuit board 11 and electronic component 15 to each other via adhesive sheet 13. Further, connection terminals 16 are electrically and mechanically connected to corresponding electrode pads 12 via conductive adhesive 17 in through-holes 14 (electronic component bonding step). For example, adhesive sheet 13 including thermosetting resin can be heated while, or after, being pressed to electronic component 15. Either method can securely bond wiring board 11 and electronic component 15.

Figure 4B:
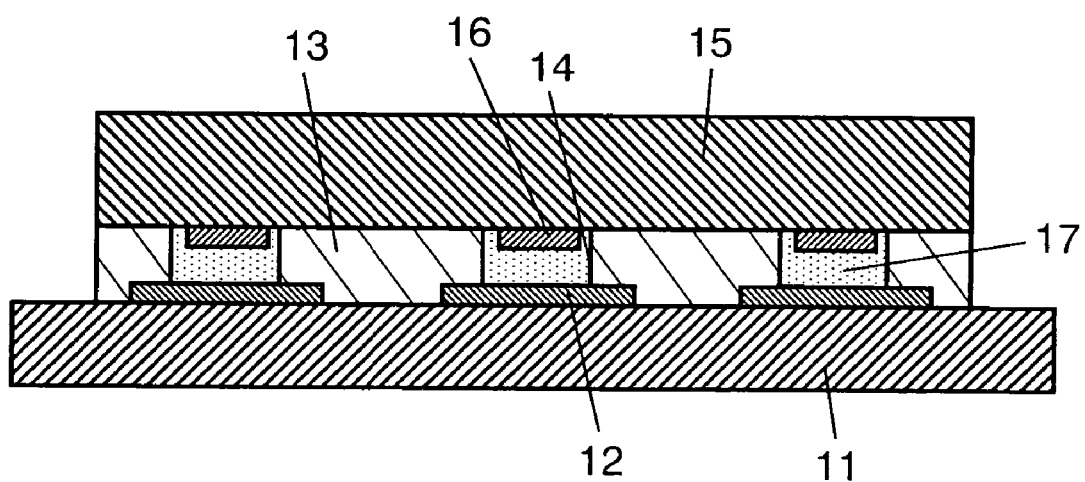
Figure 5A:
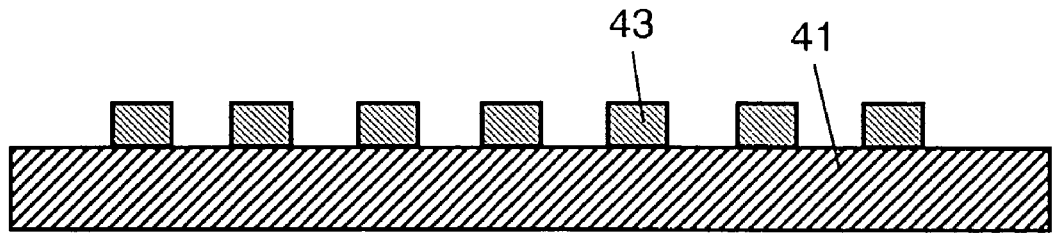
FIGS. 5A, 5B, and 5C are sectional views showing major steps of a method of manufacturing a conventional electronic circuit device.
Figure 5B:
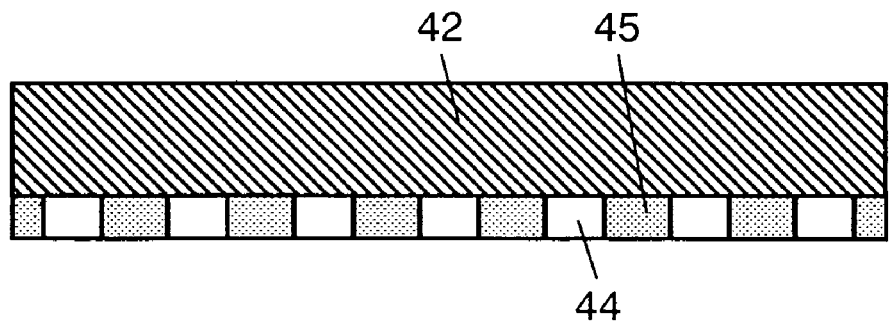
Figure 5C:
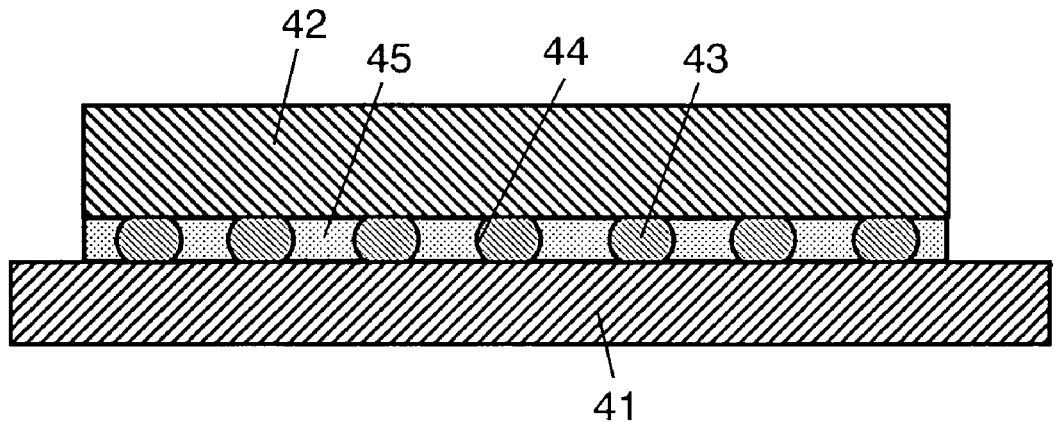

This manufacturing method can provide an electronic circuit device in which electronic component 15 is mounted on circuit board 11 as shown in FIG. 4B.

As shown in this embodiment, because connection terminals 16 on electronic component 15 are connected to electrode pads 12 on circuit board 11 via conductive adhesive 17, and electronic component 15 is connected to circuit board 11 via adhesive sheet 13, a highly reliable connection is possible even with use of sheet-shaped circuit board 11.

The present invention is not limited to the above-described manufacturing method. An electronic circuit device can also be manufactured by providing conductive adhesive 17 in through-holes 14 through adhesive sheet 13, aligning the through-holes with corresponding electrode pads 12 on circuit board 11, and then bonding adhesive sheet 13 to circuit board 11.

EXAMPLE

Hereinafter, a detailed description is provided of an electronic circuit device using an LSI as electronic component 15, and a polymeric resin sheet as circuit board 11.

Materials used as circuit board 11, electronic component 15, and conductive adhesive 17 are described below.

Used as circuit board 11 is a 100-μm-thick polyethylene terephthalate (PET) film sheet having wiring patterns formed on both sides thereof. Used as electronic component 15 is an LSI that has semi-spherical bumps 20, each approximately 0.2 mm in diameter, formed on a surface of corresponding connection terminals 16. In this case, a pitch of arranged bumps 20 is approximately 0.4 mm. Used as adhesive sheet 13 is a 0.6-mm-thick thermosetting hot-melt sheet having a curing temperature of 80° C. (Macromelt 6301 made by the Henkel Japan Ltd.) Used as conductive adhesive 17 is Ag paste. As a binder of the Ag paste, thermosetting epoxy resin having a curing temperature of 110° C. is used.

The method of manufacturing the electronic circuit device is specifically described with reference to FIGS. 3A–4B. First, wiring patterns (not shown) and electrode pads 12 are printed onto the PET film sheet by a general screen-printing method, to provide circuit board 11 as shown in FIG. 3A.

Next, according to the method described as shown in FIG. 3B, adhesive sheet 13 that has through-holes 14, each 0.3 mm in diameter and formed to be aligned with corresponding electrode pads 12 on circuit board 11, is bonded to circuit board 11. As for bonding conditions, a temperature is 80° C. and a heating time is 15 seconds.

Next, as shown in FIG. 3C, conductive adhesive 17, in an amount of approximately 0.035 to 0.040 mm$^3$ is provided in each through-hole 14, through adhesive sheet 13, by performing a screen-printing method. Then, electronic component 15 is bonded to adhesive sheet 13 so that connection terminals 16 on electronic component 15 are aligned with corresponding electrode pads 12 on circuit board 11. Further, conductive adhesive 17 is cured under heating conditions where a temperature is 110° C. and a time is 30 minutes. Thus, electronic component 15 is securely bonded to circuit board 11 via adhesive sheet 13. At the same time, connection terminals 16 and corresponding electrode pads 12 are mechanically and electrically connected via conductive adhesive 17. A resistance between electrode pads 12 and connection terminals 16 is approximately 20 m $\Omega$. Additionally, an LSI, i.e. electronic component 15, and the PET film sheet, i.e. circuit board 11, have sufficient adhesive strength. Further, an optimum combination of adhesive sheet 13 and conductive adhesive 17 can realize an electronic circuit device that has a warp of the PET film sheet at a negligible level.

The above-described method can realize an electronic circuit device by using an inexpensive and flexible polymeric resin sheet, that enables production at low temperatures, as a circuit board. Further, an adhesive sheet having conductive adhesive in through-holes thereof advantageously realizes a highly reliable electronic circuit device that provides high adhesive strength and low connection resistance between the circuit board and electronic component.

What is claimed is:

1. An electronic circuit device comprising:
    an electronic component having a connection terminal on one side thereof;
    a circuit board made of a polymeric resin sheet having a thickness of from 50μm to 400μm and having an electrode pad thereon;
    an adhesive sheet having a through-hole; and
    a conductive adhesive filled in said through-hole,
    wherein said electronic component and said circuit board are bonded to each other via said adhesive sheet, and said connection terminal on said electronic component and said electrode pad on said circuit board are bonded to each other by said conductive adhesive filled in said through-hole, and
    wherein a cross-sectional size of said connection terminal is less than a corresponding cross-sectional size of said through-hole, and said corresponding cross-sectional size of said through-hole is less than a corresponding cross-sectional size of said electrode pad, with said corresponding cross-sectional size of said electrode pad being at least twice as large as said cross-sectional size of said connection terminal.

2. The electronic circuit device according to claim 1, wherein said connection terminal protrudes into said through-hole.

3. The electronic circuit device according to claim 1, wherein said polymeric resin sheet is made of a material selected from the group consisting of polyethylene terephthalate, acrylnitrile-butadiene-styrene; and polycarbonate.

4. The electronic circuit device according to claim 1, wherein said conductive adhesive is a conductive paste consisting essentially of conductive particles and a thermosetting resin binder.

5. The electronic circuit device according to claim 1, wherein said adhesive sheet is one of a thermosetting resin sheet and a thermoplastic resin sheet.

6. The electronic circuit device according to claim 1, wherein said conductive adhesive essentially consists of conductive particles and a thermosetting resin binder, and said adhesive sheet includes a thermosetting resin, with said thermosetting resin being such that it begins to cure at a lower temperature than does said thermosetting resin binder.

* * * * *

UNITED STATES PATENT AND TRADEMARK OFFICE
CERTIFICATE OF CORRECTION

PATENT NO. : 7,186,925 B2 Page 1 of 1
APPLICATION NO. : 10/798398
DATED : March 6, 2007
INVENTOR(S) : Norihito Tsukahara et al.

It is certified that error appears in the above-identified patent and that said Letters Patent is hereby corrected as shown below:

In column 7, of claim 3, line 7, please change "acrylnitrile-butadiene-styrene;" to --acrylnitrile-butadiene-styrene,--.

Signed and Sealed this

Twentieth Day of November, 2007

JON W. DUDAS
*Director of the United States Patent and Trademark Office*